(12) United States Patent
Tsai et al.

(10) Patent No.: US 12,119,245 B2
(45) Date of Patent: Oct. 15, 2024

(54) HOT PLATE COOLING SYSTEM

(71) Applicant: Winbond Electronics Corp., Taichung (TW)

(72) Inventors: Yao-Huang Tsai, Taichung (TW); Mi-Ning Li, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 583 days.

(21) Appl. No.: 17/412,936

(22) Filed: Aug. 26, 2021

(65) Prior Publication Data
US 2022/0254661 A1 Aug. 11, 2022

(30) Foreign Application Priority Data

Feb. 9, 2021 (TW) .................. 110104926

(51) Int. Cl.
*H01L 21/67* (2006.01)
(52) U.S. Cl.
CPC .. *H01L 21/67103* (2013.01); *H01L 21/67248* (2013.01)
(58) Field of Classification Search
CPC ......... H01L 21/67103; H01L 21/67428; H01L 21/67109
USPC ....................................... 165/11.1
See application file for complete search history.

(56) References Cited

U.S. PATENT DOCUMENTS

| | | | | |
|---|---|---|---|---|
| 6,408,725 B1* | 6/2002 | Janson | ...................... | B25B 7/10 81/382 |
| 8,786,078 B1* | 7/2014 | Rau | ..................... | H05K 7/2029 257/776 |
| 9,293,352 B2* | 3/2016 | Hashizume | ....... | H01L 21/02488 |
| 11,133,175 B2* | 9/2021 | Hanawa | ............ | H01L 21/67103 |
| 2003/0121902 A1* | 7/2003 | Tanoue | ............. | H01L 21/67109 219/465.1 |
| 2007/0166655 A1* | 7/2007 | Ooshima | ........... | H01L 21/67017 432/120 |
| 2007/0298622 A1* | 12/2007 | Terasaki | ............ | H01J 37/32678 438/770 |
| 2008/0006294 A1* | 1/2008 | Saxena | ................ | H05K 3/3494 134/2 |

(Continued)

FOREIGN PATENT DOCUMENTS

JP 2005019593 A 1/2005

*Primary Examiner* — Len Tran
*Assistant Examiner* — Gustavo A Hincapie Serna
(74) *Attorney, Agent, or Firm* — Muncy, Geissler, Olds & Lowe, P.C.

(57) ABSTRACT

A hot plate cooling system is provided, configured to cool a hot plate, including a chamber and a cooling module. The hot plate is placed in the chamber. The cooling module extends into the chamber and faces the hot plate. The cooling module includes a nozzle member, a shell member, and a discharge channel. The nozzle member faces the hot plate for spraying a working fluid onto the hot plate. The shell member has a receiving groove surrounding the nozzle member. The discharge channel is connected to the shell member and communicates with the receiving groove. When the nozzle member sprays the working fluid to cool the hot plate, the working fluid is conveyed through the nozzle member toward a surface of the hot plate, and the working fluid is sequentially discharged from the hot plate cooling system through the receiving groove to the discharge channel.

7 Claims, 4 Drawing Sheets

(56) References Cited

U.S. PATENT DOCUMENTS

| | | | | |
|---|---|---|---|---|
| 2009/0314467 A1* | 12/2009 | Campbell | ........... | H01L 23/4735 165/80.4 |
| 2012/0171632 A1* | 7/2012 | Novak | ................. | C03B 29/025 432/14 |
| 2013/0059403 A1* | 3/2013 | Lee | ...................... | G01J 5/0007 257/E21.521 |
| 2014/0140006 A1* | 5/2014 | Kuhlmann | .............. | H01L 23/00 165/104.33 |
| 2014/0284787 A1* | 9/2014 | Joshi | ....................... | F28D 15/00 257/714 |
| 2014/0290703 A1* | 10/2014 | Kobayashi | ........ | H01L 21/67051 134/33 |
| 2015/0043164 A1* | 2/2015 | Joshi | ........................ | G06F 1/20 165/185 |
| 2015/0096722 A1* | 4/2015 | Zweiback | ........... | H01S 3/08072 165/104.33 |
| 2015/0255257 A1* | 9/2015 | Kawabe | ............ | H01J 37/32724 156/345.31 |
| 2015/0359133 A1* | 12/2015 | Joshi | .................... | H05K 7/2039 165/287 |
| 2016/0293401 A1* | 10/2016 | Hara | .......................... | B08B 3/08 |
| 2016/0314939 A1* | 10/2016 | Sastri | ....................... | C04B 35/64 |
| 2017/0323823 A1* | 11/2017 | Si | ........................ | H01L 21/67115 |
| 2017/0347487 A1* | 11/2017 | Rudnicki | ................. | F28F 13/12 |
| 2018/0174868 A1* | 6/2018 | Sugihara | ............ | H01L 21/67051 |
| 2018/0223426 A1* | 8/2018 | Shono | ............... | H01L 21/67017 |
| 2019/0291144 A1* | 9/2019 | Siefering | ........... | H01L 21/67109 |
| 2019/0364691 A1* | 11/2019 | Subrahmanyam | ........................... | H05K 7/20518 |
| 2020/0006101 A1* | 1/2020 | Chen | .................... | H01L 21/67248 |
| 2020/0234980 A1* | 7/2020 | Hanawa | ............ | H01L 21/67034 |
| 2021/0020462 A1* | 1/2021 | Jeong | ................ | H01L 21/67051 |
| 2021/0233747 A1* | 7/2021 | Yamaguchi | ............. | H01L 21/67 |
| 2021/0348624 A1* | 11/2021 | Diglio | ................... | F04D 29/588 |
| 2021/0351106 A1* | 11/2021 | Subrahmanyam | ........................... | G01R 31/2642 |
| 2022/0115217 A1* | 4/2022 | Yu | ..................... | H01J 37/32724 |

* cited by examiner

HOT PLATE COOLING SYSTEM

CROSS REFERENCE TO RELATED APPLICATIONS

This application claims priority of Taiwan Patent Application No. 110104926, filed on Feb. 9, 2021, the entirety of which is incorporated by reference herein.

BACKGROUND OF THE INVENTION

Field of the Invention

The present invention relates to a hot plate cooling system, and, in particular, to a hot plate cooling system with a cooling module.

Description of the Related Art

During a semiconductor manufacturing process, such as a semiconductor wafer manufacturing process, a platform that may perform predetermined temperature control (e.g. baking) on a wafer is required in some of the manufacturing processes. Typically, a hot plate serves as a platform. Different temperature may be required to process different wafers. It would be inefficient for manufacturing process that requires the environment temperature to drop from high to low when natural cooling is used. In view of this, it is important to provide an efficient and smart system for temperature processing and control.

BRIEF SUMMARY OF THE INVENTION

In accordance with some embodiments, a hot plate cooling system is provided, configured to cool a hot plate, including a chamber and a cooling module. The hot plate is placed in the chamber. The cooling module extends into the chamber and faces the hot plate to cool the hot plate. The cooling module includes a nozzle member, a shell member, and a discharge channel. The nozzle member faces the hot plate for spraying the working fluid onto the hot plate. The shell member surrounds the nozzle member, and the nozzle member is arranged in the shell member. The shell member has a receiving groove surrounding the nozzle member. The discharge channel is connected to the shell member and communicates with the receiving groove. When the nozzle member sprays the working fluid to cool the hot plate, the working fluid is conveyed through the nozzle member toward the surface of the hot plate, and the working fluid is sequentially discharged from the hot plate cooling system through the receiving groove to the discharge channel.

The nozzle member has a main flow channel and a nozzle communicating with the main flow channel. The nozzle protrudes from the shell member.

The nozzle member has a plurality of nozzles accommodated in the shell member and surrounded by the receiving groove.

Each of the nozzles has an elongated structure, and the nozzles extend in different directions.

The cooling module further includes an air extracting device, disposed at the discharge channel for extracting the working fluid flowing through the receiving groove to the discharge channel.

The cooling module further includes a pneumatic device, disposed at a main flow channel of the nozzle member for spraying the working fluid from the nozzle member through the main flow channel.

The hot plate cooling system includes a receiving unit, a classifying unit, and a server unit. The receiving unit is configured to receive default information, sensing temperature information of the hot plate and obtaining status information. The classifying unit is electrically connected to the receiving unit and the classifying unit. The server unit is electrically connected to the pneumatic device. When the receiving unit determines that there is a difference between the temperature of the hot plate in the default information and the temperature of the hot plate in the status information, the receiving unit sends an alarm log to the classifying unit. The receiving unit sends the default information and the status information to the classifying unit. The classifying unit sorts out the default temperature information based on the default information, and sorts out the status temperature information based on the status information, and also sends the alarm log, the default temperature information and the status temperature information to the server unit. The server unit sends a control signal to the pneumatic device based on the alarm log, the default temperature information and the status temperature information.

The receiving unit receives pieces of status information from different time points, and delivers the pieces of status information to the classifying unit. The classifying unit sorts out pieces of status temperature information based on the pieces of status information, and delivers the pieces of status temperature information to the server unit. When the server unit determines that there is a difference among the pieces of status temperature information and receives the alarm log, the server unit sends the control signal to the pneumatic device and turns the pneumatic device on.

The pieces of status temperature information include a first status temperature information and a second status temperature information. The first status temperature information is received by the server unit before the second status temperature information is received. When the tendency of the first status temperature information toward the default temperature information is different from the tendency of the second status temperature information toward the first status temperature information, the server unit sends a warning signal to an external control unit.

The hot plate cooling system further includes a fluid detection assembly disposed in a main flow channel of the nozzle member and the discharge channel.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
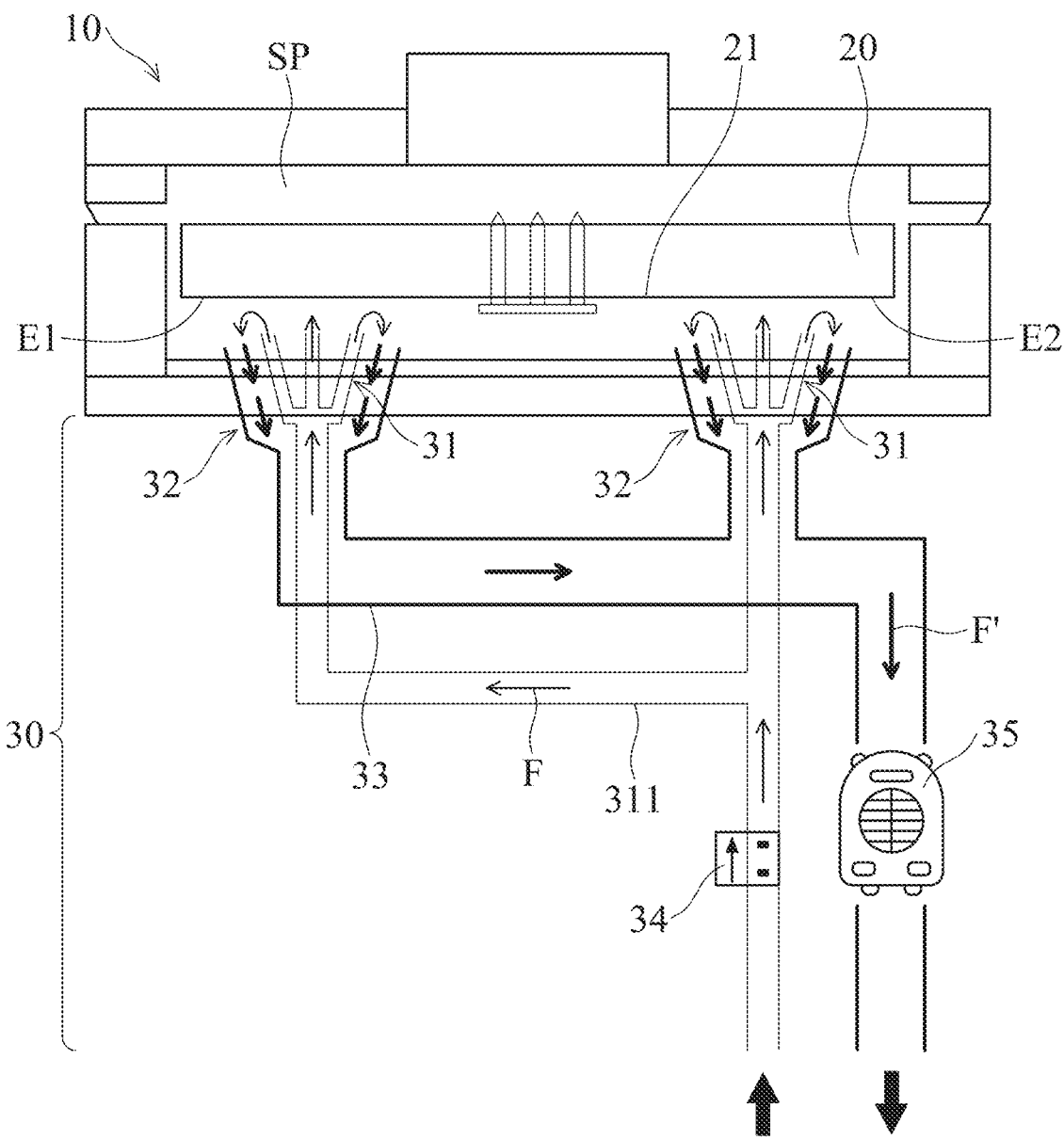
FIGS. 1 and 4 show schematic views of a hot plate cooling system of different embodiments of the present invention.

FIG. 1 shows a schematic view of a hot plate cooling system 100 of an embodiment of the present invention. The hot plate cooling system 100 may be applied in a machine system for manufacturing one or more wafers in a semiconductor manufacturing process.

The hot plate cooling system 100 includes a chamber 10, a hot plate 20, and a cooling module 30. The chamber 10 has an accommodating space SP. The hot plate 20 is disposed inside the accommodating space SP, and used for heating the wafer. The cooling module 30 is installed through the accommodating space SP of the chamber 10, the cooling module 30 extends into the accommodating space SP of the chamber 10 from outside the chamber 10 for controlling or adjusting temperature, such as cooling, the hot plate 20. The manufacturing process is thus performed in a predetermined temperature.

The cooling module 30 has multiple (two) nozzle members 31, disposed on two opposite ends of the hot plate 20, respectively. In other words, the nozzle members 31 are disposed on a first end E1 and a second end E2 of the hot plate 20 that are close to the nozzle members 31, wherein the first end E1 and the second end E2 are opposite from each other, the nozzle member 31 is configured to spray the working fluid F, cooling the hot plate 20. A shell member 32 is disposed near each of the nozzle members 31, surrounding the nozzle members 31. In other words, the nozzle member 31 is disposed inside the shell member 32.

Figure 2:
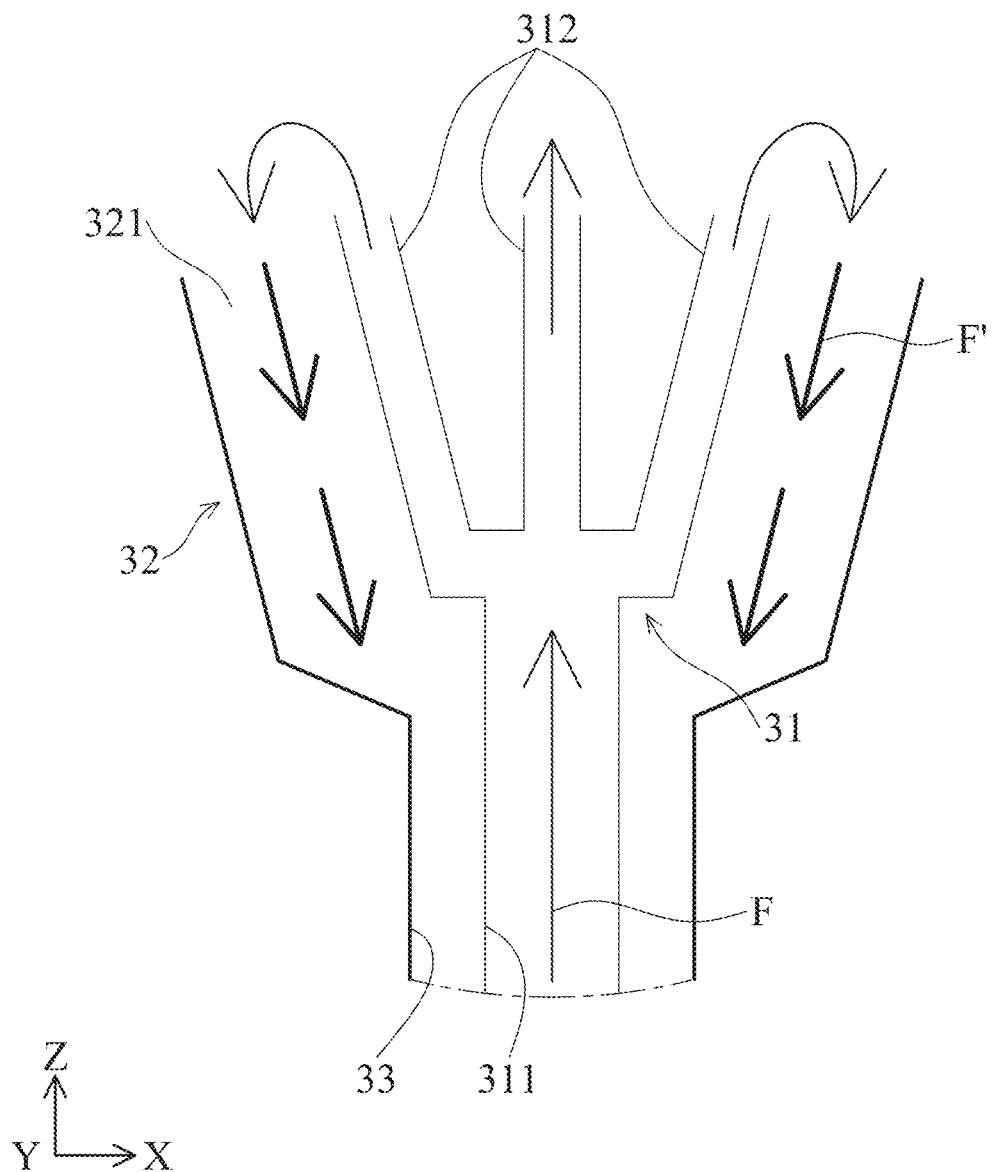
FIG. 2 shows a schematic view of an enlarged part of a nozzle member and the flow of the working fluid.

Referring to FIG. 1 and FIG. 2, the shell member 32 has a receiving groove 321 surrounding the nozzle member 31. The cooling module 30 further includes a discharge channel 33, communicating with the receiving groove 321 of the shell member 32. The receiving groove 321 is configured to receive the working fluid F sprayed or delivered from the nozzle member 31, so as to recycle or discharge the working fluid F for temperature controlling, such as heat emitting, the hot plate 20. The receiving groove 321 communicates with the discharge channel 33, so as to discharge the sprayed working fluid F' from the hot plate cooling system 100.

In detail, when the nozzle member 31 sprays the working fluid F to cool the hot plate, the working fluid F is conveyed through the nozzle member 31 toward a surface 21 of the hot plate 20. After that, the sprayed working fluid F, that is the working fluid F', is received by receiving groove 321, sequentially discharged from the hot plate cooling system 100 through the receiving groove 321 to the discharge channel 33.

Referring to FIG. 2, it should be noted that the nozzle member 31 has a main flow channel 311 and a plurality of nozzles 312 that are accommodated inside the shell member 32 and protrude from the shell member 32. In other words, the height of the nozzle 312 is greater than the height of the shell member 32 in the z direction, and the nozzle 312 is closer to the hot plate 20 (see FIG. 1). As such, the hot plate 20 may be cooled by the working fluid F, and the cooling of the hot plate 20 may be accelerated, improving the efficiency of the manufacturing process, each of the nozzles 312 has an elongated structure, and each nozzle 312 extends in a different direction, the nozzle member 31 may include one nozzle 312 for spraying the working fluid F to cool the hot plate.

A pneumatic device 34 is disposed at the main flow channel 311 of the nozzle member 31 for spraying the working fluid F quickly and smoothly from the nozzle 312 through the main flow channel 311. The pneumatic device 34 may also serve as an air supply unit, configured to provide the working fluid F, an air extracting device 35, such as a blast blower, is disposed at the discharge channel 33 for extracting the working fluid F' flowing through the receiving groove 321 to the discharge channel 33. Other than accelerating the discharge of the working fluid F', it may also collect the particles produced by the working fluid F during the cooling of the hot plate 20, thereby improving the cleanliness of the manufacturing process.

Figure 3:
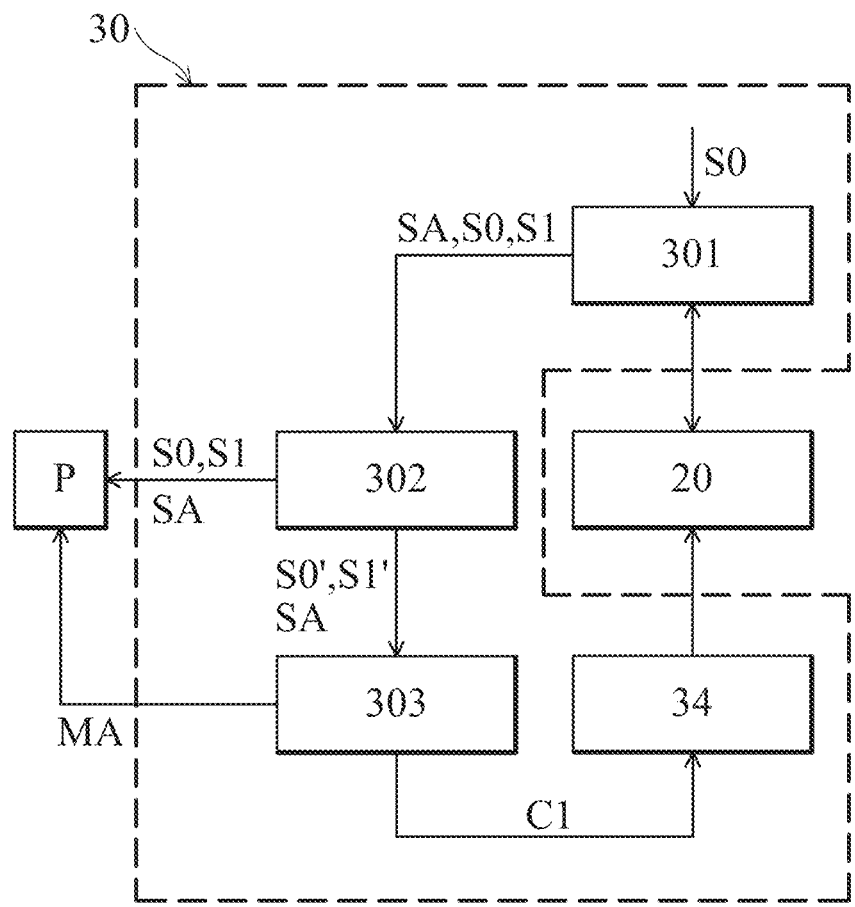
FIG. 3 shows a schematic view of the sensing and temperature control of the cooling module to the hot plate.

FIG. 3 shows a schematic view of the sensing and temperature control of the cooling module 30 to the hot plate 20. The cooling module 30 further includes a receiving unit 301, a classifying unit 302, and a server unit 303.

The receiving unit 301 may receive, for example, one or more elements with given formulas, configured to sense the current status of the chamber 10 and/or the hot plate 20, such as the temperature information, the humidity information, and the pressure information of the chamber 10 and/or the hot plate 20, the receiving unit 301 is electrically connected to the classifying unit 302. The classifying unit 302 may be a fault detection and classification (FDC) unit, configured to collect the data from the receiving unit 301, the FDC unit may provide univariate and multivariate analyses based on the states and requirements of the manufacturing process, respectively.

The server unit 303 is electrically connected to the classifying unit 302 and the pneumatic device 34. The server unit 303 may receive the information from the classifying unit 302, and calculate an applicable control signal based on the information for controlling the pneumatic device 34.

Regarding the temperature control by the cooling module 30 to the hot plate 20, specifically, the receiving unit 301 first receives a piece of default information S0, such as a default recipe, so as to learn about the requirement in the manufacturing process for the temperature of the hot plate 20. The hot plate 20 is then sensed to obtain a piece of status information S1 including a data of the temperature status of the hot plate 20, the default information S0 includes the temperature information, the humidity information, and the pressure information of the chamber 10 and/or the hot plate 20.

Next, the default information S0 and the status information S1 are compared. If the temperature data of the hot plate 20 of the default information S0 and the status information S1 are different, an alarm log SA would be sent. The alarm log SA, the default information S0 and the status information S1 are delivered to the classifying unit 302, wherein the classifying unit 302 obtains or sorts out a piece of default temperature information S0' and a piece of status temperature information S1' based on the default information S0 and the status information S1, and also sends the alarm log SA, the default temperature information S0' and the status temperature information S1' to the server unit 303, the classifying unit 302 delivers the complete default information S0 and the status information S1 as well as the alarm log SA to an external control unit P (such as an user computer), allowing the operator to be notified and to monitor in real time.

After that, the server unit 303 receives the alarm log SA, and the temperature information S0' (the default temperature) and S1' (the current temperature of the hot plate 20) from the classifying unit 302. Based on these information, a control signal C1 is calculated, by which the pneumatic device 34 is controlled to be turned on/off.

The receiving unit 301 may detect the temperature of the hot plate 20 alternately, and deliver to the classifying unit 302 in real time. The classifying unit 302 receives the status information S1 of different time points at given time intervals. The classifying unit 302 then sorts out the parts where temperature information is included from the status information S1, and delivers the status temperature information S1' to the server unit 303.

The server unit 303 compares the status temperature information S1' of different time points, and controls the pneumatic device 34 to be turned on/off. For example, the server unit 303 receives a piece of status temperature information S1' of the current status every other second (i.e. the receiving unit 301 is set to deliver a piece of the status information S1 every other second), and compares the previously received status temperature information S1' with the subsequently received status temperature information S1'. When the subsequently received temperature is lower than the previously received temperature, it shows that the manufacturing process is about to perform cooling. The default temperature information S0' and the subsequently received status temperature information S1' are then compared to generate the control signal C1 for turning on the pneumatic device 34.

As such, since the control signal comes from the server unit 303 that generates the control signal based on the information provided by the receiving unit 301 and the classifying unit 302, compared with the traditional temperature adjusting method by using a temperature controller, the embodiments of the present disclosure use the original sensing status information to perform regulation of the temperature of the hot plate 20 without an additional temperature control signal, thereby improving the stability of the whole cooling module, preventing signals from fading.

When the deviation between the default temperature information S0' and the status temperature information S1' received by the server unit 303 and the deviation between the previous and subsequent status temperature information S1' do not correspond, a warning signal MA is sent to the control unit P. For example, when the temperature value of the default temperature information S0' is 90° C., and the previous (the first) status temperature information S1' is 95° C., this means that the manufacturing process is going to perform a cooling operation (from 95° C. to 90° C.). However, when the subsequent (the second) status temperature information S1' is 96° C., this means that the temperature of the hot plate 20 is rising (from 95° C. to 96° C.), which is abnormal, the server unit 303 thus sends a warning signal MA to the control unit P for the operator to handle this situation. In other words, the pieces of status temperature information S1' at least include an earlier first status temperature information and a latter second status temperature information, wherein the first status temperature information is received by the server unit 303 before the second status temperature information. When the tendency of the first status temperature information toward the default temperature information S0' is different from the tendency of the second status temperature information toward the first status temperature information, the server unit 303 sends a warning signal MA to an external control unit P, when the server unit 303 sends the warning signal MA, the control signal C1 is also sent to the pneumatic device 34 to turn it off.

A normal close valve is used in the pneumatic device 34. When the power is cut off or during other anomalies, the pneumatic device 34 may be turned off automatically to prevent any accidents.

Figure 4:
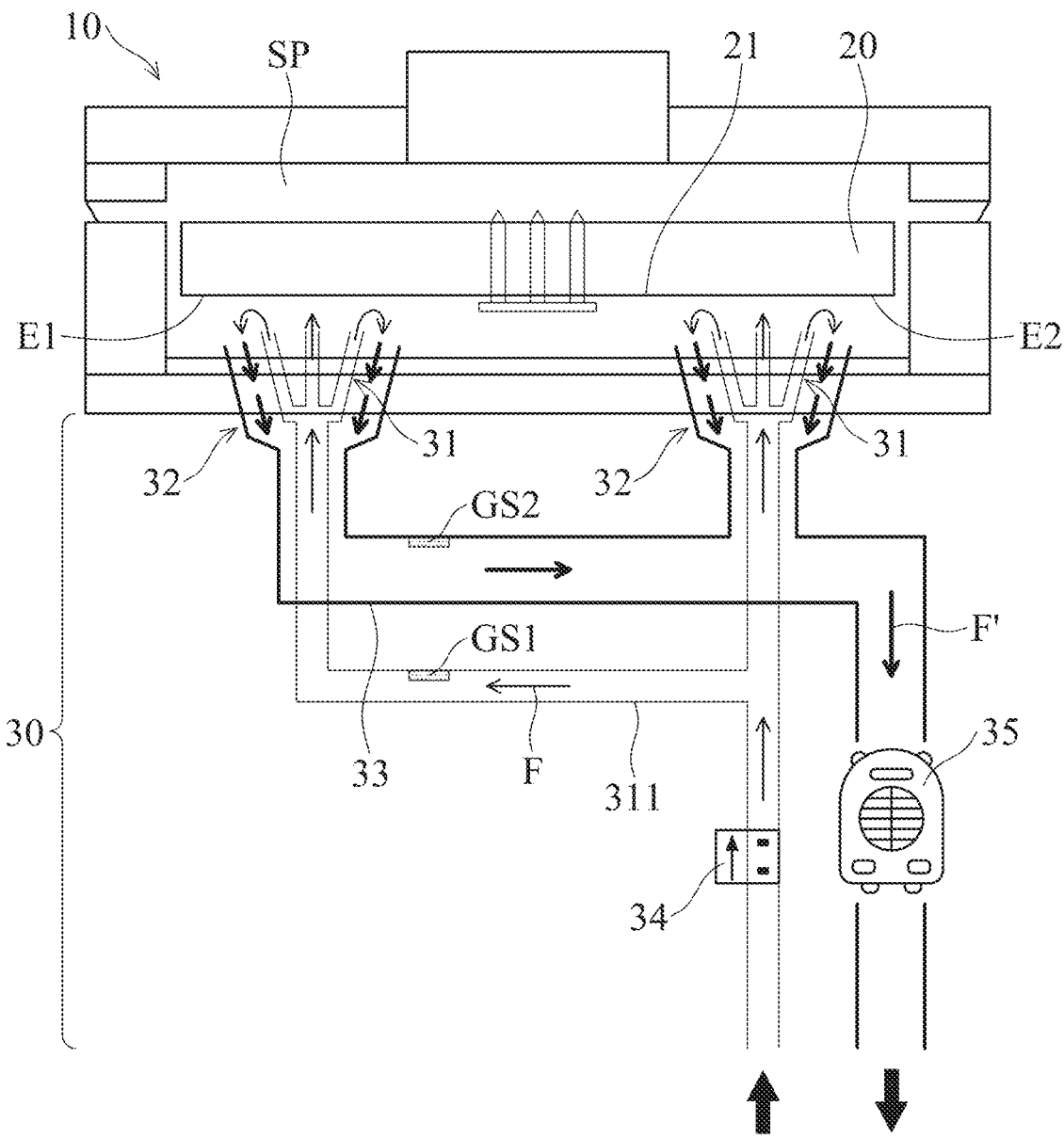

Referring to FIG. 4, fluid detectors GS1 and GS2 are disposed in the main flow channel 311 of the nozzle member 31 and the discharge channel 33, configured to detect the flow or existence of the fluid, indicating if an abnormality has occurred. For example, when the valve of the pneumatic device 34 is closed, a flow of the fluid is detected in the main flow channel; or when the pneumatic device 34 is turned on and the valve is open, but no flow of the fluid is detected, the fluid detectors GS are electrically connected to the control unit P. When the abnormality occurs, a warning signal may be sent to the control unit P, a fluid detection assembly GS may consist of the fluid detector GS1 and GS2.

A hot plate cooling system is configured to cool a hot plate, including a chamber and a cooling module. The hot plate is placed in the chamber. The cooling module extends into the chamber and faces the hot plate to cool the hot plate. The cooling module includes a nozzle member, a shell member, and a discharge channel. The nozzle member faces the hot plate for spraying the working fluid onto the hot plate. The shell member surrounds the nozzle member, and the nozzle member is arranged in the shell member. The shell member has a receiving groove surrounding the nozzle member. The discharge channel is connected to the shell member and communicates with the receiving groove. When the nozzle member sprays the working fluid to cool the hot plate, the working fluid is conveyed through the nozzle member toward the surface of the hot plate, and the working fluid is sequentially discharged from the hot plate cooling system through the receiving groove to the discharge channel.

The hot plate cooling system includes a receiving unit, a classifying unit, and a server unit. The receiving unit is configured to receive default information, sensing the temperature information of the hot plate and obtaining status information. The classifying unit is electrically connected to the receiving unit and the classifying unit. The server unit is electrically connected to the pneumatic device. When the receiving unit determines that there is a difference between the temperature of the hot plate in the default information and the temperature of the hot plate in the status information, the receiving unit sends an alarm log to the classifying unit. The receiving unit sends the default information and the status information to the classifying unit. The classifying unit sorts out the default temperature information based on the default information, and sorts out the status temperature information based on the status information, and also sends the alarm log, the default temperature information and the status temperature information to the server unit. The server unit sends a control signal to the pneumatic device based on the alarm log, the default temperature information and the status temperature information.

The embodiments of the present disclosure have at least one of the following advantages or effects. Through the arrangement of the nozzle member and the shell member of the cooling module, the working fluid may cool the hot plate smoothly, and the working fluid may be recycled instantly and effectively, achieving a fast and safe cooling operation. In addition, the pneumatic device that provides the working fluid in the cooling module is controlled by the server unit, which generates the control signal based on the information delivered by the receiving unit and the classifying unit. Compared with the traditional temperature adjusting method using a temperature controller, the embodiment of the present disclosure utilizes the original sensing status information to perform regulation of temperature of the hot plate without additional temperature control signals. This may improve the stability of the whole cooling module, preventing signals from fading, thus improving the overall efficiency and quality of the manufacturing process.

What is claimed is:

1. A hot plate cooling system for cooling a hot plate, comprising:
    a chamber, wherein the hot plate is placed in the chamber; and
    a cooling module, extending into the chamber and facing the hot plate to cool the hot plate, including:

a nozzle member, facing the hot plate for spraying a working fluid onto the hot plate;

a shell member, surrounding the nozzle member, wherein the nozzle member is arranged in the shell member having a receiving groove surrounding the nozzle member; and a discharge channel, connected to the shell member and communicating with the receiving groove;

wherein when the nozzle member sprays the working fluid to cool the hot plate, the working fluid is conveyed through the nozzle member toward a surface of the hot plate, and the working fluid is sequentially discharged from the hot plate cooling system through the receiving groove to the discharge channel;

wherein the cooling module further includes a pneumatic device, disposed at a main flow channel of the nozzle member for spraying the working fluid from the nozzle member through the main flow channel;

wherein the hot plate cooling system further comprises:

a receiving unit for receiving default information, sensing temperature information of the hot plate and obtaining status information;

a classifying unit; and a server unit, wherein the server unit is electrically connected to the receiving unit and the classifying unit, and the server unit is electrically connected to the pneumatic device;

wherein when the receiving unit determines that there is a difference between the temperature of the hot plate in the default information and the temperature of the hot plate in the status information, the receiving unit sends an alarm log to the classifying unit, and the receiving unit sends the default information and the status information to the classifying unit;

wherein the classifying unit sorts out default temperature information based on the default information, and sorts out status temperature information based on the status information, and also sends the alarm log, the default temperature information and the status temperature information to the server unit;

wherein the server unit sends a control signal to the pneumatic device based on the alarm log, the default temperature information and the status temperature information;

wherein the receiving unit receives pieces of status information from different time points, and delivers the pieces of status information to the classifying unit;

wherein the classifying unit sorts out pieces of status temperature information based on the pieces of status information, and delivers the pieces of status temperature information to the server unit;

wherein when the server unit determines that there is a difference among the pieces of status temperature information and receives the alarm log, the server unit sends the control signal to the pneumatic device and turns the pneumatic device on.

2. The hot plate cooling system as claimed in claim 1, wherein the nozzle member has the main flow channel and a nozzle communicating with the main flow channel, and wherein the nozzle protrudes from the shell member.

3. The hot plate cooling system as claimed in claim 1, wherein the nozzle member has a plurality of nozzles accommodated in the shell member and surrounded by the receiving groove.

4. The hot plate cooling system as claimed in claim 3, wherein each of the nozzles has an elongated structure, and the nozzles extend in different directions.

5. The hot plate cooling system as claimed in claim 1, wherein the cooling module further includes an air extracting device, disposed at the discharge channel for extracting the working fluid flowing through the receiving groove to the discharge channel.

6. The hot plate cooling system as claimed in claim 1, wherein the pieces of status temperature information include first status temperature information and second status temperature information, and the first status temperature information is received by the server unit before the second status temperature information is received;

wherein when a tendency of the first status temperature information toward the default temperature information is different from a tendency of the second status temperature information toward the first status temperature information, the server unit sends a warning signal to an external control unit.

7. The hot plate cooling system as claimed in claim 1, further comprising a fluid detection assembly disposed in the main flow channel of the nozzle member and the discharge channel.

* * * * *